US006277546B1

(12) United States Patent
Breyta et al.

(10) Patent No.: US 6,277,546 B1
(45) Date of Patent: Aug. 21, 2001

(54) PROCESS FOR IMAGING OF PHOTORESIST (75) Inventors: Gregory Breyta; Nicholas Jeffries Clecak, both of San Jose; William Dinan Hinsberg, III, Fremont; Donald Clifford Hofer, San Martin; Hiroshi Ito; Scott Arthur MacDonald, both of San Jose, all of CA (US); Ratnam Sooriyakumaran, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/345,290

(22) Filed: Nov. 28, 1994

Related U.S. Application Data (63) Continuation of application No. 07/971,140, filed on Nov. 3, 1992, now abandoned.

(51) Int. Cl.$^7$ .......................................................... G03F 7/26

(52) U.S. Cl. ....................... 430/322; 430/270.1; 430/327; 430/330

(58) Field of Search .................................. 430/270, 281, 430/322, 327, 330

(56) References Cited

U.S. PATENT DOCUMENTS

| | | | |
|---|---|---|---|
| 4,430,419 | 2/1984 | Harada | 430/296 |
| 4,476,217 | 10/1984 | Douglas et al. | 430/326 |
| 4,491,628 | 1/1985 | Ito et al. | 430/176 |
| 4,608,281 | 8/1986 | Deckman et al. | 427/385.5 |
| 4,618,564 | 10/1986 | Demmer et al. | 430/270 |
| 4,777,119 | 10/1988 | Brault et al. | 430/296 |
| 4,824,763 | 4/1989 | Lee | 430/258 |
| 4,840,876 | 6/1989 | Arai | 430/328 |
| 4,842,992 | 6/1989 | Arai | 430/328 |
| 4,845,143 | 7/1989 | Ito et al. | 525/328.8 |
| 4,869,996 | 9/1989 | McCartin et al. | 430/286 |
| 4,897,337 | 1/1990 | Kato et al. | 430/296 |
| 4,931,379 | 6/1990 | Brunsvold et al. | 430/270 |
| 4,939,070 | 7/1990 | Brunsvold et al. | 430/312 |
| 4,980,264 | 12/1990 | Chiong et al. | 430/192 |
| 5,024,922 | 6/1991 | Moss et al. | 430/330 |
| 5,071,730 | 12/1991 | Allen et al. | 430/270 |
| 5,164,278 | 11/1992 | Brunsvold et al. | 430/176 |

FOREIGN PATENT DOCUMENTS

| | | | |
|---|---|---|---|
| 37 21 741 | 1/1989 | (DE) | G03F/7/10 |
| 0 404 206 | 12/1990 | (EP) | G03F/7/039 |
| 0 508 174 | 10/1992 | (EP) | G03F/7/004 |
| 0 510 445 | 10/1992 | (EP) | C07C/309/73 |
| 58-114030 | 7/1983 | (JP) | G03C/1/72 |
| 05-107757 | 4/1993 | (JP) | G03F/7/022 |
| 05-158232 | 6/1993 | (JP) | G03F/7/022 |

OTHER PUBLICATIONS

Hinsberg, MacDonald, Clecak, Snyder Ito, Influence of Polymer Properties on Airborne Chemical Contamination of Chemically Amplified Resists, SPIE vol. 1925/43, pp. 43–52, 1/93.

Hinsberg, MacDonald Clecak, Snyder, Fundamental Studies of Airborne Chemical Contamination of Chemically Amplified Resists, Jour. of Photopolymer Science & Technology, vol. 6, No. 4 pp535–546, 1993.

Rogers, Semancik, Kapur, Transport Processes in Polymers, Div. of Macromolecular Science Case Western Reserve University, Cleveland, Ohio, pp.297–319.

Matsuoka & Kwei, Ch. 6 Physical Behavior of Macromolecules, Bell Telephone Lab., pp. 398–407, 1979.

Kishimoto, Enda, Diffusion of Benzene in Polyacrylates, Jour. of Polymer Science: Part A vol. 1, pp1799–1811, 1963.

Kishimoto, Diffusion and Viscosity of Polyvinyl Acetate––Diluent Systems, Physical Chem. Lab., Dept. of Fisheries, Univ. of Kyoto, Maizuru, Japan pp.1421–1439, 1964.

Fujita, Kishimoto, Matsumoto, Concentration and Temperature Dependence of Diffusion Coefficients for Syst. Polymethyl Acrylate and n–Alkyl Acetates, Physical Chem. Lab, Dept. of Fisheries, Univ. of Kyoto, Maizuru, Japan pp424–437.

Quano, Dependence of Dissolution Rate on Processing and Molecular Parameters of Resists, 1984 American Chemical Society, pp79–90.

Paniez, Pons, Joubert, Free Volume and Viscosity Effects in Polymer Layers: Applicaton to Lithographic Processes, SPIE vol. 1262, Advances in Resist Technology and Processing VII, pp483–492, 1990.

Papanu, Manjow, Hess, Soong, Bell, Dissolution and Swelling Studies of Poly(methyl methacrylate) Resist Film, SPIE vol. 771, Advances in Resist Technoloy & Processing IV pp93–101 1987.

O. Nalamasu et al., "An Overview of Resist Processing for Deep–UV Lithography", Journal of Photopolymer Sci. & Tech., vol. 4, No. 3, pp. 299–318, 1991.

L. Schlegel et al., "Determination of Acid Diffusion in Chemical Amplification Positive Deep Ultraviolet Resists", J. Vac. Sci. Technol. B9 (2), Mar./Apr. 1991, pp. 278–289.

H. Ito et al., "Copolymer Approach to Design of Sensitive Deep–UV Resist Systems with High Thermal Stability and Dry Etch Resistance", American Chemical Society, 1989.

O. Nalamasu et al., "Preliminary Lithographic Characteristics of an All–organic Chemically Amplified Resist Formulation for Single Layer Deep–UV Lithography", SPIE vol. 1466, Advances in Resist Technology and Processing VIII (1991).

(List continued on next page.)

Primary Examiner—Kathleen Duda
(74) Attorney, Agent, or Firm—Robert B. Martin (57) ABSTRACT

The present invention relates to an improved lithographic imaging process for use in the manufacture of integrated circuits. The process provides protection to the photoresist film from airborne chemical contaminants.

14 Claims, 3 Drawing Sheets

OTHER PUBLICATIONS

F. Houlihan et al., "An Evaluation of Nitrobenzyl Ester Chemistry for Chemical Amplification Resists", SPIE vol. 920 Advances in Resist Technology and Processing V (1988).

D. McKean et al., "Novolac Based Deep–UV Resists", SPIE vol. 920 Advances in Resist Technology and Processing V (1988).

O. Nalamasu et al., "Development of a Chemically Amplified Positive (CAMP) Resist Material for Single Layer Deep–UV Lithography", SPIE vol. 1262 Advances in Resist Technology and Processing VII (1990).

M. Murata et al., "An Aqueous Base Developable Novel Deep–UV Resist for KrF Excimer Laser Lithography", SPIE vol. 1262 Advances in Resist Technology and Processing VII (1990).

W. Feely, "Microplastic Structures", SPIE vol. 631 Advances in Resist Technology and Processing III (1986).

L. Schlegel et al., "Diffusion of Photogenerated Acid in Chemical Amplification Positive Deep UV Resists", Journal of Photopolymer Sci. and Technol. vol. 4, No. 3 (1991) pp. 455–462.

D. Conlon et al., Synthesis, Characterization, and Deblocking of Poly(4–tert–butoxystyrene) and Poly(4–tert–butoxy–α–methylstyrene), American Chemical Society (1989).

N. Hayashi et al., "Tetrahydropyranyl and Tetrahydrofuranyl Protected Polyhydroxystyrenes in Chemical Amplification Resist Systems for KrF Excimer Laser Lithography", Central Research Laboratory, Hitachi Ltd., Kokubunji, Tokyo, Japan R. Schwalm, "Success: A Novel Concept Regarding Photoactive Compounds", BASF AG, D–6700 Ludwigshafen.

L. Schlegel et al., "Acid Formation and Deprotection Reaction by Novel Sulfonates in a Chemical Amplification Positive Photoresist", American Chemical Society, (1990).

K. Sugita et al., "Performance Control of Positive–Working Electron Beam Resists by Copolymerization and Blending", Polymer Journal, vol. 17, No. 10, pp. 1091–1103. (1985).

H. Ito et al., "Applications of Photoinitiators to the Design of Resists for Semiconductor Manufacturing", American Chemical Society, 1984.

H. Ito, "Solid–State Thermolysis of Poly(p–t–Butoxycarbonyloxystyrene) Catalyzed by Polymeric Phenol: Effect of Phase Separation", Journal of Polymer Science: Part A Polymer Chemistry Edition, vol. 24, pp. 2971–2980 (1986).

J. Nakamura et al., "Effect of Acid Diffusion on Resolution of a Chemically Amplified Resist in X–Ray Lithography", Japanese Journal of Applied Physics, vol., 30, No. 10, Oct., 1991, pp. 2619–2625.

W. Brunsvold et al., "Polyhydroxystyrene Carbonate Esters for High Sensitivity Photoresists Having Autodecompositon Temperatures > 160°", SPIE vol. 1086 Advances in Resist Technology and Processing VI (1989).

H. Ito et al., "Positive/Negative Mid UV Resists with High Thermal Stability", SPIE vol. 771, Advances in Resist Technology and Processing IV (1987).

H. Ito et al., "Thermolysis and Photochemical Acidolysis of Selected Polymethacrylates", American Chemical Society 1988.

V. Sharma et al., "Copolymer Electron Resists: Poly(styrene–methyl methacrylate) Copolymers", Polymer, 1983, vol. 24, Apr.

H. Ito et al., "Chain Scission Efficiency and Reactive–Ion Etch Resistance of Alternating Copolymers of Styrene and Olefins Trisubstituted or Tetrasubstituted with Electron––Withdrawing Groups", Journal of Polymer Science: Part A: Polymer Chemistry, vol. 24, 955–964 (1986).

MacDonald et al., "Airborne Chemical Contamination of a Chemically Amplified Resist", SPIE vol. 1466, Advances in Resist Technology and Processing VIII (1991).

"Synthesis of Deep UV Grade Polyhydroxystyrene", IBM Technical Disclosure Bulletin, vol. 33, No. 5, Oct. 1990, p. 296.

Nicholas K. Eib et al, "Characterization and Simulation of Acid Catalyzed DUV Positive Photoresist", SPIE, vol. 1925, pp. 186–194.

John Sturtevant et al., "Post–exposure Bake Characteristics of a Chemically Amplified Deep–ultraviolet Resist", SPIE, vol. 1672, 1992, pp. 114–124.

FIG. 1

Film A

Film B

PROCESS FOR IMAGING OF PHOTORESIST

"This is a continuation of application Ser. No. 07/971,140 filed on Nov. 3, 1992, now abandoned.

FIELD OF THE INVENTION

The present invention relates to an improved lithographic imaging process for use in the manufacture of integrated circuits.

BACKGROUND OF THE INVENTION

Presently there is a desire in the industry for higher circuit density in microelectronic devices which are made using lithographic techniques. One method of increasing the number of components per chip is to decrease the minimum feature size on the chip, which requires higher lithographic resolution. There is a goal in industry to reduce feature size to 0.25 microns. The use of shorter wavelength radiation (e.g. deep UV e.g. 190 to 315 nm) than the currently employed mid-UV spectral range (e.g. 350 nm to 450 nm) offers the potential for this higher resolution. However, with deep UV radiation, fewer photons are transferred for the same energy dose and higher exposure doses are required to achieve the same desired photochemical response. Further, current lithographic tools have greatly attenuated output in the deep UV spectral region.

In order to improve resolution, Deckman et al. U.S. Pat. No. 4,608,281 (issued Aug. 26, 1986discloses the use of an electron beam exposure tool. Poly(methyl methacrylate) (PMMA) which undergoes main chain scission upon e-beam exposure is used as the resist material. After exposure the degraded polymer is removed with solvent to develop the image. Deckman teaches pre-exposure baking of the polymeric resist above its glass transition temperature (Tg) to remove solvent and improve resolution. Brault et al. U.S. Pat. No. 4,777,119 (issued Oct. 11, 1988also discloses pre-exposure baking of PMMA resist above its Tg to crosslink the polymer to improve its lithographic performance. Unfortunately, the lithographic mechanism of Deckman and Brault of main chain scission polymer degradation requires high exposure doses of radiation and is not suitable for manufacturing processes.

In order to improve the sensitivity of a resist for use in the deep UV, Ito et al. developed an acid catalyzed chemically amplified resist which is disclosed in U.S. Pat. No. 4,491,628 (Jan. 1, 1985). The resist comprises a photosensitive acid generator and an acid sensitive polymer. The polymer comprises side chain (pendant) groups which are bonded to the polymer backbone and are reactive towards a proton. Upon imagewise exposure to radiation, the photoacid generator produces a proton. The resist film is heated and, the proton causes catalytic cleavage of the pendant group from the polymer backbone. The proton is not consumed in the cleavage reaction and catalyzes additional cleavage reactions thereby chemically amplifying the photochemical response of the resist. The cleaved polymer is soluble in polar developers such as alcohol and aqueous base while the unexposed polymer is soluble in nonpolar organic solvents such as anisole. Thus the resist can produce positive or negative images of the mask depending of the selection of the developer solvent.

Nalamasu et al., "An Overview of Resist Processing for Deep-UV Lithography", J. Photopolym. Sci. Technol. 4, 299 (1991) also discloses a chemically amplified resist composition comprising a photoacid generator and poly(t-butoxycarbonyloxystyrene sulfone).

Schlegel et al., "Determination of Acid Diffusion in Chemical Amplification Positive Deep Ultraviolet Resist", J. Vac. Sci. Technol. 278 March/April 1991 discloses a chemically amplified resist comprising a photoacid generator and a chemically amplified dissolution inhibitor p-tetrahydropyranyl protected polyvinylphenol disposed in novolac resin. Schlegel teaches using a high pre-exposure bake temperature in combination with a low post-exposure bake temperature. However, due to the high absorbance of the novolac resin in the deep UV, such a composition is unsuitable for use in semiconductor manufacturing in the deep UV.

Further, because of the catalytic nature of the imaging mechanisms, these chemically amplified resist systems are sensitive toward minute amounts of airborne chemical contaminants such as basic organic substances. These substances degrade the resulting developed image in the resist film and cause a loss of the linewidth control of the developed image. This problem is exaggerated in a manufacturing process where there is an extended and variable period of time between applying the film to the substrate and development of the image. In order to protect the resist from such airborne contaminants, the air surrounding the coated film is carefully filtered to remove such substances. Alternatively, the resist film is overcoated with a protective polymer layer. However, these are cumbersome processes. There still is a need in the art for a process for imaging chemically amplified resists for use in semiconductor manufacturing.

It is therefore an object of the present invention to provide an improved process for imaging of photoresist.

Other objects and advantages will become apparent from the following disclosure.

SUMMARY OF THE INVENTION

The present invention relates to a process for generating a resist image on substrate comprising five steps. The first step involves coating the substrate with (i) a vinyl polymer (ii) a photosensitive acid generator, and (iii) acid labile groups. In one embodiment, the acid labile groups are pendant from the polymer backbone. In another embodiment, the acid labile groups are on a molecule disposed in the polymer. Upon exposure to acid, the acid labile groups undergo a polarity change which results in dissolution differentiation. The second step involves heating the film to an elevated temperature which is preferably at or above the glass transition temperature of the polymer and below the temperature which causes thermally activated polarity change in the acid labile group. The third step involves imagewise exposing the film to radiation to generate free acid. In the fourth step, the film is heated to an elevated temperature preferably at least above about 110° C. The acid generated from the photosensitive acid generator converts the acid labile groups to polar groups which alter the solubility of the polymer in the exposed area of the film. The last step of the process involves developing the image with standard techniques such as solvent development.

The key features of the process of the present invention are the second and fourth steps. The second step involves post apply, pre-exposure heating to an elevated temperature preferably to a temperature which is at or above the glass transition temperature (Tg) of the polymer and below the temperature which causes thermally activated polarity change of the acid labile group. The fourth step involves post-exposure heating of the film to a high temperature. The combination of the pre-exposure heating step and the post-exposure heating step provides unexpected protection of the resist film from airborne chemical contaminants during the process for generating a resist image on the substrate and also provides developed images with high constrast and high resolution.

Preferably, in the process of the present invention, the polymer is a copolymer comprised of a hydroxystyrene monomer and a monomer having an acid labile group. Preferably, the acid labile group is an acid cleavable group, preferably an acid cleavable ester group.

The present invention also relates to an integrated circuit formed using the process of the present invention.

A more thorough disclosure of the present invention is presented in the detailed description which follows and from in accompanying drawings in which.

DETAILED DESCRIPTION OF THE INVENTION

The present invention relates to an improved process for generating a resist image on a substrate. The first step of the process of the present invention involves coating on a substrate a polymeric film comprising a vinyl polymer, a photosensitive acid generator and acid labile groups. In one embodiment, the acid labile groups are pendant from the vinyl polymer backbone. In another embodiment, the acid labile groups are on a molecule disposed in a base soluble vinyl polymer.

The polymer in the film is a vinyl polymer. The vinyl polymer is a polymer derived from vinyl monomer. The vinyl polymer can be a homopolymer, a copolymer or terpolymer. The vinyl polymer will generally have a number average molecular weight of about 5000 to about 50,000 and preferably be transparent in the deep U.V. suitably at least 30% transmission/micrometer at 248 nm preferably at least 50% transmission/micrometer at 248 nm and more preferably at least 65% transmission/micrometer. Suitable base soluble vinyl polymers are poly(hydroxystyrene), poly(vinylbenzoic acid), poly(acrylic acid), poly(methacrylic acid), polymaleimide and copolymers thereof.

In one embodiment of the present invention, the polymer comprises acid labile groups pendant from the vinyl polymer backbone. The acid labile groups inhibit the dissolution of the polymer in alkaline developer or polar solvent. Upon imagewise exposure, the photogenerated acid converts the acid labile group from dissolution-inhibiting to base-soluble functionality, thereby enabling image development of the film.

Preferred acid labile groups pendant from the vinyl polymer backbone are acid cleavable groups such as acid cleavable ester groups. Upon exposure to photogenerated acid, the side chain acid cleavable groups pendant from the polymer backbone are cleaved to form polar recurring units on the polymer backbone which are soluble in alkaline developer or polar solvents.

In a preferred embodiment, the vinyl polymer comprises (i) a vinyl monomer having a base soluble substituent such as a phenolic or carboxylic acid substituent and (ii) a vinyl monomer having the acid labile group.

Polymers for use in the process of the present invention have a glass transition temperature lower than the thermal cleavage temperature of the acid labile group. Thermal cleavage of the acid labile groups results in the formation of polar groups. If the film is heated to the cleavage temperature of the acid labile groups, these groups in the film are converted to polar groups in the absence of acid or radiation and the film can no longer be lithographically developed. Heating the film to even higher temperatures can cause thermal main chain scission (decomposition) of the polymer in the film.

The glass transition temperature (Tg) of the polymer can be readily determined by art known procedures such as a differential scanning calorimetry or dynamic mechanical analysis. The thermal cleavage temperature of the acid-labile group of the polymer can be determined by thermogravimetric analysis, IR spectroscopy, or dissolution analysis. Thermogravimetric analysis involves heating the material at a constant rate and recording weight loss. IR spectroscopy involves heating several samples and then analyzing the IR spectra of the samples to determine the extent of thermal cleavage of the acid labile group. Dissolution analysis involves heating several films at various temperatures and then determining reduction in film thickness after development.

Preferred acid labile group are acid cleavable groups. The preferred acid cleavable groups are t-butyl and α-methylbenzyl esters of carboxylic acids and t-butylcarbonates of phenols. Other suitable acid labile groups include tetrahydropyranyl or furanyl ether, trimethylsilyl or t-butyl(dimethyl)silyl ether, and t-butoxycarbonylmethyl ether of phenol. However, it is understood that a wide range of acid labile groups are operative in the process of the present invention such as those disclosed in Ito et al. U.S. Pat. No. 4,491,628, the disclosure of which is incorporated herein by reference. Brunsvold et al., U.S. Pat. Nos. 4,931,379 (Jun. 5, 1990) and 4,939,070 (Jul. 3, 1990) disclose suitable thermally stable acid labile groups and associated polymer resists and the disclosure of Brunsvold is also incorporated herein by reference. The presence of acidic groups such as phenols or carboxylic acid groups in the film tends to thermally destabilize the acid labile group toward thermal cleavage. Certain acid labile groups may be unsuitable in the presence of phenolic or carboxylic acid groups due to their thermal and/or hydrolytic instability.

A variety of vinyl polymers and copolymers can be used in the process of the present invention.

Poly(m-t-butoxycarbonyloxystyrene) is a suitable vinyl polymer. It can be readily prepared by standard radical polymerization or cationic polymerization in liquid sulfur dioxide of m-t-butoxycarbonyloxystyrene or by the reaction of poly(m-hydroxystyrene) with di-t-butyl dicarbonate. Poly(m-t-butoxycarbonyloxystyrene) has a Tg of about 90° C. and an acid labile cleavage temperature of about 190° C. Copolymers of m-t-butoxycarbonylxystyrene are also suitable for use in the present invention such as copolymers with hydroxystyrene, vi-nylbenzoic acid, acrylic acid and methacylic acid.

Another suitable polymer is poly(t-butyl p-vinylbenzoate) which has a glass transition temperature of about 160° C. and an acid labile cleavage temperature of about 250° C. Poly(t-butyl-m-vinylbenzoate) is also suitable. This polymer can be readily prepared by radical polymerization or anionic polymerization of t-butyl p-vinylbenzoate. The polymer undergoes acid-catalyzed deesterification to poly(p-vinylbenzoic acid) upon irradiation and postexposure bake, allowing dual tone imaging depending on the polarity of the developer solvent. Copolymers of vinyl benzoates are also suitable for use in the present invention such as copolymers with hydroxystyrene, vinylbenzoic acid, acrylic acid and methacrylic acid.

In another embodiment of the process of the present invention, the vinyl polymer having the acid labile group can be blended as a dissolution inhibitor with a base soluble vinyl polymer such as poly(m-hydroxystyrene) which is generally transparent in the deep UV and has a lower Tg than some other base soluble vinyl polymers such as poly(p-hydroxystyrene). The acid catalyzed conversion of the acid labile group converts the dissolution inhibiting acid labile group to a base soluble functionality thereby enabling image development with aqueous base. Alternatively, in another embodiment, the acid labile group can be attached to a molecule which is blended with a base soluble vinyl polymer. Suitable molecules having the acid labile group include t-butyl carbonate of bisphenol A and t-butyl ester of cholic acid. The molecule can also have an acid generator moiety.

In a preferred embodiment of the process of the present invention, the vinyl polymer is a copolymer comprising (i) a vinyl monomer having a base soluble substituent such as a phenolic or carboxylic acid substituent and (ii) a vinyl monomer having the acid labile group. The base soluble substituent is preferably a phenol and the acid labile group is preferably an acid cleavable group, preferably an acid cleavable ester group. A preferred copolymer is preferably formed from the reaction of hydroxystyrene precursor monomer and a second monomer having an acid cleavable group. The hydroxystyrene is suitably the para or meta isomer and can be substituted with various substituents which do not interfere with the process of the present invention such as halogens, methoxy, or lower alkyl (e.g. methyl or ethyl). Hydroxy-α-methylstyrene can also be used. The second monomer is suitably alkyl acrylate or alkyl methacrylate, preferably where the alkyl substituent is a t-butyl group or an α-methylbenzyl group. Preferred copolymer are meta and para poly(hydroxystyrene-comethacrylate/acrylate).

The copolymer used in the process of the present invention can be prepared by standard radical copolymerization to yield random copolymers. For example, t-butyl methacrylate can be copolymerized with (i) p-tert-butoxycarbonyloxystyrene with subsequent thermal cleavage or mild acidolysis of the t-butoxycarbonyl group to form p-hydroxystyrene/t-butyl methacrylate copolymer or (ii) with p-t-butyl(dimethyl)silyloxystyrene with subsequent desilylation with fluoride. Alternatively, and preferably, pac-etoxystyrene is copolymerized with t-butyl acrylate with subsequent deacylation with mild base (e.g. dimethylaminopyridine, ammonium hydroxide, carbonate or bicarbonate) in preferably an alcohol solvent (methanol, ethanol or propanol) to form the hydroxystyrene/t-butyl acrylate copolymer. Preferably, the copolymer contains the hydroxystyrene unit in the range of 50 to 90 mol % and has the number-average molecular weight (relative to polystyrene standard) ranging from 7,000 to 50,000. The glass transition temperature of the copolymer of p-hydroxystyrene with t-butyl methacrylate or acrylate is about 140° C. to about 170° C. and the acid labile thermal cleavage temperature of the copolymer is generally above about 180° C. The copolymer can be directly used in the resist formulation or can be blended with another polymer or small molecule. Blending with polyhydroxystyrene is particularly useful in adjusting the dissolution rate in aqueous base.

A variety of photosensitive acid generators can be used in the process of the present invention. Generally, suitable generators will be thermally stable (e.g. to a temperature>130° C.) so they are not degraded during the pre-exposure heating step. Suitable photosensitive acid generators for use in the present invention include triarylsulfonium triflate or hexafluoroantimonate, nitrobenzyl tosylate (for lower temperature pre-exposure heating step), diaryliodo-nium metal halides, and certain non-ionic acid generators such as tris(sulfonate) of pyrogallol, and N-sulfonyloxynaphthalimides. Preferred are triphenylsulfonium triflate and N-sulfonyloxynaphthalimide generators such as N-camphorsulfonyloxynaphthalimide or N-pentafluorobenzenesulfonyloxynaphthalimide.

The first step of the process involves coating the substrate with a film comprising the polymer, a photosensitive acid generator and acid labile groups all dissolved in a suitable solvent. Suitable substrates are comprised of silicon, ceramics, polymer or the like. Suitable organic casting solvents include methyl cellosolve acetate, cyclohexanone, propylene glycol monomethyl ether acetate, and the like. The film will preferably comprise about 80 to about 99.5 weight % of the polymer and about 20 to about 0.5 weight % of the photoacid generator both dissolved in the organic solvent. Optionally, the film can contain additives such as plasticizers to lower the Tg of the polymer and also polymers and small molecules to adjust the films dissolution rate, etch resistance, optical density, radiation sensitivity, adhesion and the like. The film can be coated on the substrate using art known techniques such as spin or spray coating, doctor blading or electrodeposition.

In the second step of the process of the present invention, the film is heated at generally atmospheric pressure to an elevated temperature which is below the acid labile thermal cleavage temperature and which is defined by the glass transition temperature (Tg in centigrade) of the polymer. In one embodiment, the film is heated to an elevated temperature which is below the acid labile thermal cleavage temperature and which is high enough to be at least above about 30 centigrade degrees below the glass transition temperature of the polymer. Preferably the film is heated to a temperature which is high enough to be at least about (polymer Tg −20° C.) to obtain greater protection. More preferably, to obtain greater protection, the film is heated to a temperature which is at or above the glass transition temperature of the polymer (e.g. within 10° C. of Tg) and below the acid labile thermal cleavage temperature. Most preferably, the film is heated above the Tg of the vinyl polymer. Preferably the temperature is at least 10° C. below the thermal cleavage temperature of the acid labile group to avoid any cleavage of the acid labile groups. The cleavage of the acid labile groups in the pre-exposure bake step will result in degradation of any image subsequently formed in that film. The heating does not cause crosslinking of the polymer. The heating is continued for a short time of at least about 10 to 15 seconds (preferably a minimum of about 30 seconds) to about 15 minutes. The heating step occurs prior to exposure of the film to radiation. The pre-exposure heating step in combination with the post-exposure heating step surprisingly functions to protect the film and undeveloped image formed in the film after exposure from airborne chemical contaminants during the extended and variable pre-and post-exposure period prior to the development of the image in the film and also provides developed images with high contrast and high resolution.

In the third step of the process, the film is imagewise exposed to a low dose of radiation suitably electromagnetic or electron beam radiation preferably electromagnetic, preferably deep ultraviolet or x-ray more preferably deep ultraviolet radiation at a wavelength of about 190 to 315 nm more preferably at a wavelength of about 248 nm. Suitable radiation sources include mercury, mercury/xenon, and xenon lamps, excimer laser, electron beam or x-ray. Generally the deep U.V. exposure dose is less than 100 millijoule/cm$^2$ preferably less than 50 Millijoule/cm$^2$. Generally, the exposure of the film is at ambient temperature. In the exposed areas of the film, photosensitive acid generator produces free acid. Because the radiation dose is so low, there is essentially negligible radiation induced cleavage of the acid labile group and negligible radiation induced main chain scission decomposition of the polymer. The free acid causes acid catalyzed cleavage of the acid labile groups in the exposed area. The cleavage of the acid labile groups alters the dissolution rate of the polymer and the differential solubility between the exposed and unexposed areas of the film enable development of the image in the film.

After the film has been exposed to radiation, it is heated again to an elevated temperature, preferably at least about 110° to about 160°C., preferably 120° C. to about 160° C. and more preferably about 130° to about 160° C. for a short period of time of about 30 to 300 seconds. In some cases, the film is heated to a temperature which is at or above the Tg of the vinyl polymer and below the cleavage temperature of the acid labile group. The elevated temperature functions in part to enhance the acid catalyzed cleavage of the acid labile pendant group. However, this high temperature post-exposure baking in combination with the pre-exposure heating step surprisingly functions to protect the film and undeveloped image formed in the film after exposure from airborne chemical contaminants during the extended and variable pre-and post-exposure period prior to the development of the image in the film and also provides developed images with high contrast and high resolution.

The last step of the process of the present invention involves development of image in the film. Suitable development techniques are known to those skilled in the art. Preferably, the image is solvent developed preferably in an aqueous base solvent for environmental improvement, preferably an aqueous base solvent without metal ions such as aqueous tetraalkyl ammonium hydroxide. Preferably the image is a positive tone. The image in the film has high resolution and straight side walls without defects caused by extended exposure to airborne chemical contaminants.

The present invention also relates to an integrated circuit made by the process of the present invention such as a circuit chip or semiconductor device comprising a circuit made by the steps of:

a. coating the substrate with a film comprising (i) a vinyl polymer, (ii) a photosensitive acid generator and (iii) acid labile groups;

b. heating the film to a temperature which is within about 20° C of the glass transition temperature of the polymer and below the temperature which cause thermal cleavage of the acid labile group;

c. imagewise exposing the film to radiation to generate a free acid;

d. beating the film to a temperature above about 110° C.;

e. developing the image to expose the substrate; and f. forming the circuit in the developed film on the substrate by art known techniques.

After the substrate has been exposed by development, circuit patterns can be formed in the exposed areas by coating the substrate with a conductive material such as conductive metals by art known techniques such as evaporation, sputtering, chemical vapor deposition or laser induced deposition. Dielectric materials may also be deposited by similar means during the process of making circuits. Inorganic ions such as boron, phosphorous or arsenic can be implanted in the substrate in the process for making p or n doped circuit transistors. Other means for forming circuits will be known by those skilled in the art.

The following examples are detailed descriptions of methods of preparation and use of the process of the present invention. The detailed preparations fall within the scope of, and serve to exemplify, the more generally described methods set forth above. The examples are presented for illustrative purposes only, and are not intended as a restriction on the scope of the invention.

EXAMPLE I

Synthesis of m-t-Butoxycarbonyloxystyrene m-Hydroxybenzaldehyde (819 mmol, 100.0 g) was placed in a 5 L 3-necked round bottom flask equipped with a mechanical stirrer and an argon gas inlet, to which was added THF (4.5 L). Potassium t-butoxide (834 mmol, 93.7 g) was slowly added to the solution over 3 min. After 15 min, di-t-butyl dicarbonate (834 mmol, 182.3 g) was added over 15 min. After 2.5 hr at room temperature the reaction mixture was poured into 4 L of water and the product was extracted with 2 L of a mixture of hexanes and ether (1:1). The organic layers were combined, washed with saturated NaCl (2 L), saturated $NaHCO_3$ (1 L), and $H_2O$ (2 L), and dried over $MgSO_4$ (ca. 100 g). The organic phase was filtered and condensed to give m-(t-butoxycarbonyloxy) benzaldehyde (792 mmol, 176 g) in 97% crude yield. Methyl(triphenyl)phosphonium bromide (848 mmol, 303 g) was placed in a 2 L 3-necked round bottom flask containing 1.5 L of THF. The mixture was cooled to 0° C. under nitrogen and potassium t-butoxide (830 mmol, 93.1 g) was added slowly to the mixture over 10 min. m-(t-Butoxycarbonyloxy)benzaldehyde (792 mmol, 176 g) was added and the mixture was stirred for another 6 h, upon which the solvent was removed on a rotary evaporator and hexanes (1.5 L) added. The mixture was stirred for 2 h and filtered through a small bed of silica. The hexane layer was concentrated to give 120 g of the crude product. Purification by column chromatography gave 85 g of pure m-(t-butoxycarbonyloxy)styrene (47% yield based on m-hydroxybenzaldehyde).

EXAMPLE II

Synthesis of Poly(m-t-butoxycarbonyloxystyrene)

m-(t-Butoxycarbonyloxy)styrene (227 mmol, 50.0 g) was placed in a 500 mL round bottom flask and dissolved in 150 g of toluene (distilled from $CaH_2$), to which was added 1 mol % of benzoyl peroxide (0.55 g, 2.27 mmol). The flask was capped with an air-tight condenser and a gas adapter attached to an argon gas line. After degassing, the content was heated at 60° C. for 46 h under argon atmosphere. The polymerization mixture was diluted with 200 mL of dichloromethane and poured into 4 L of methanol with vigorous stirring. The polymer was isolated by filtration, washed with 400 mL of methanol, and dried at 35° C. under vacuum for 48 h, providing 71.8% conversion. The number-average and weight-average molecular weights of the polymer as determined by GPC (gel permeation chromatography) were 79,000 and 238,000, respectively. The glass transition temperature was 90° C. The weight-average molecular weight of the polymer was controlled by changing the initiator concentration and the solvent concentration and ranged from 20,800 to 238,000.

EXAMPLE III

Synthesis of Copolymer of m-t-Butoxycarbonyloxystyrene with m-Hydroxystyrene

A powder of poly[(m-t-butoxycarbonyloxy)styrene] was heated at 180° C. for 1 hr and converted to poly(m- hydroxystyrene) quantitatively. The deprotection was also achieved by treating the polymer with acid in solution (e.g. refluxing glacial acetic acid).

Poly(m-hydroxystyrene) (3.0 g) thus obtained and N,N-dimethylaminopyridine (0.03 g) were dissolved in 40 mL of acetone, to which was added dropwise a solution of di-t-butyl dicarbonate (0.005 g) in 30 mL of acetone. After stirring at room temperature for 6 hr, glacial acetic acid (0.062 g) dissolved in 5 mL of acetone was added dropwise to the reaction mixture over 30 min. The solution was slowly poured into 750 mL of water with vigorous stirring to precipitate the copolymer of m-hydroxystyrene with m-t-butoxycarbonyloxystyrene. The copolymer was recovered by filtration, washed with water, and briefly dried. The copolymer was then dissolved in 50 mL of acetone and the solvent was removed on a rotary evaporator at 40° C. The process was repeated several times and the copolymer (2.85 g) was finally dried in a vacuum oven. The copolymer contained 20 mole % of the m-t-butoxycarbonyloxystyrene unit. Copolymers with different compositions were also prepared in a similar fashion by adjusting the ratio of di-t-butyl dicarbonate to poly(m-hydroxystyrene).

EXAMPLE IV

Synthesis of Copolymer of t-Butyl Methacrylate with m-Hydroxystyrene via Copolymerization and Solid-State Thermolysis t-Butyl methacrylate (1.77 g, 12.5 mmol) and m-t-butoxycarbonyloxystyrene (8.23 g, 37.4 mmol) were dissolved in 25 mL of tetrahydrofuran, to which was added 400 mg of benzoyl peroxide. After degassing, the mixture was heated at 60° C. for 24 hr. The resulting mixture was diluted with dichloromethane and slowly poured into 4 L of a mixture of methanol and water (10:1) with vigorous stirring to precipitate the copolymer (7.36 g). The polymer isolated by filtration, washed with methanol, and dried had a number-average and weight-average molecular weights of 18,800 and 35,700, respectively.

The copolymer powder was heated on a Kuegelrohr apparatus at 180° C. for 1 hr under vacuum to quantitatively yield a m-hydroxystyrene copolymer containing 20 mole % of the t-butyl methacrylate unit.

EXAMPLE V

Synthesis of Copolymer of t-Butyl Methacrylate with p-Hydroxystrene via Copolymerization and Solution Thermolysis A 5 L 3-necked flask fitted with a mechanical stirrer, thermometer, and condenser with a gas inlet was charged with 430.5 g of p-t-butoxycarbonyoxystyrene, 69.5 g of t-butyl methacrylate, 18.5 g of benzoyl peroxide, and 625 mL of toluene. After ten vacuum/argon purge cycles, the mixture was heated to 60–65° C. under positive argon pressure. After 18 hr heating was removed. The mixture was diluted by adding 1.3 L of acetone and slowly poured into a mixture of 12.5 L isopropanol and 3.75 L water with vigorous stirring. The copolymer was isolated by filtration, rinsed four times with a mixture of 1.3 L isopropanol and 0.4 L water, sucked dry, and further dried in a vacuum oven at 60° C. overnight. The polymer was dissolved in 1.5 L of acetone, reprecipitated in a mixture of 9 L isopropanol and 2.75 L of water, filtered, washed twice with a mixture of 1.3 L isopropanol and 0.4 L water, and sucked dry. Further drying to constant weight in a vacuum oven at 50–55° C. afforded 421 g of white polymer (81.2% conversion).

The copolymer (27.93 g) was dissolved in 83.0 g of propylene glycol monomethyl ether acetate in a round bottom flask equipped with a condenser and gas inlet. The system was deaerated by repeating vacuum/argon purge cycles ten times and left under positive argon pressure. The solution was heated for 20 hr under gentle reflux to give a 17% solution of the desired p-hydroxystyrene/t-butyl methacrylate (80/20) copolymer, which was directly formulated into resist by adding an acid generator.

EXAMPLE VI

Synthesis of Copolymer of t-Butyl Acrylate with p-Hydroxystyrene via Copolymerization and Base Hydrolysis A 12 L reactor was charged with 973.1 g of p-acetoxystyrene, 512.7 g of t-butyl acrylate, 77.0 g of benzoyl peroxide, and 2 L of toluene. The reactor was purged with nitrogen while the temperature was brought to 60° C. and then kept under a nitrogen blanket. After heating at 60° C. for 23 hr, heating was removed and the mixture was diluted with 4 L of toluene. The solution was slowly poured into 80 L of heptane containing 4 L of isopropanol to precipitate the copolymer, which was isolated by filtration, rinsed with heptane, and sucked dry. The polymer was dissolved in 5 L of acetone, precipitated into a mixture of 70 L of isopropanol and 30 L of water, filtered, rinsed with 30 L of a 50/50 mixture of isopropanol and water, and sucked dry. Further drying in a vacuum oven at 50–55° C. afforded 1.0 kg of the copolymer.

A 12 L reactor was charged with 1.0 kg of the above copolymer and 5.5 L of methanol, and then purged with nitrogen while slowly heated to 40° C. over 1 hr. While maintaining a nitrogen blanket, 100 mL of ammonium hydroxide was added. After 19.5 hr the heating was removed, 93.3 mL of glacial acetic acid added, and the resulting solution poured into 80 L of water. The polymer was filtered, rinsed with water, sucked dry, and redissolved in 6 L of acetone. After precipitation into 80 L of water, the polymer was isolated by filtration, rinsed with water, sucked dry, and then placed in a vacuum oven at 50–55° C. The desired p-hydroxystyrene copolymer containing 35 mole % of t-butyl acrylate was obtained in 90.7 yield (741.5 g).

EXAMPLE VII

Lithographic Performance

Figure 1:
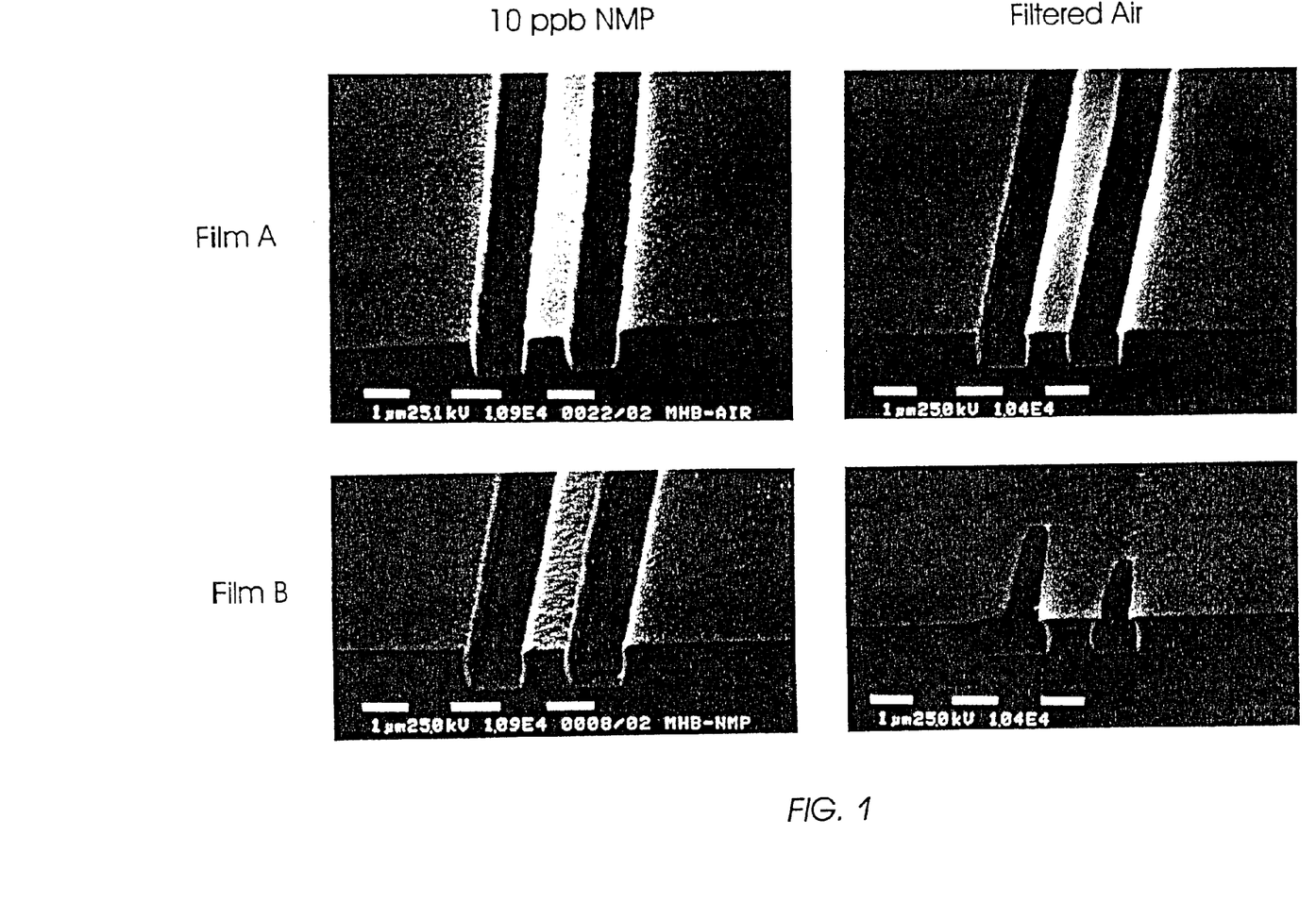
FIGS. 1–3 are scanning electron micrographs of resist images.

Poly meta-(t-butoxycarbonyloxystyrene-cohydroxystyrene) containing 20 mole % of the t-butoxycarbonyloxystyrene unit (Tg=125° C.) and 8.0 wt % of trifluoromethanesulfonyloxybicyclo[2.2.1]hept-5-ene-2, 3-dicarboximide were dissolved in propylene glycol monomethyl ether acetate. This resist formulation was compared in terms of susceptibility to contamination by NMP with the same formulation using the para isomer of the polymer. (Tg 166° C.) The spin-cast resist films were pre-exposure-baked at about 90° C. for 60 sec, stored for 15 minutes in air doped with 10 ppb of NMP, patternwise exposed on a Perkin Elmer Micralign 500 mirror projection scanner in the UV-2 mode, postbaked at 90° C. for 90 sec, and developed with Shipley Microposit MF319 (aqueous tetramethylammonium hydroxide) for 90 sec to obtain positive images. As a controls, the resists were processed without delay and also stored in carbon filtered air prior to the scanner exposure. The doses required to open 1 µm line/space arrays were 2600 and 3000 scan speed for the meta and para versions, respectively. FIG. 1 shows scanning electron micrographs of the resist images which reveal that the meta polymer resist image (film A) was unaffected by the NMP treatment whereas the para polymer resist image (image B) exhibited severe T-top profiles and massive skin layers.

EXAMPLE VIII

Figure 2:
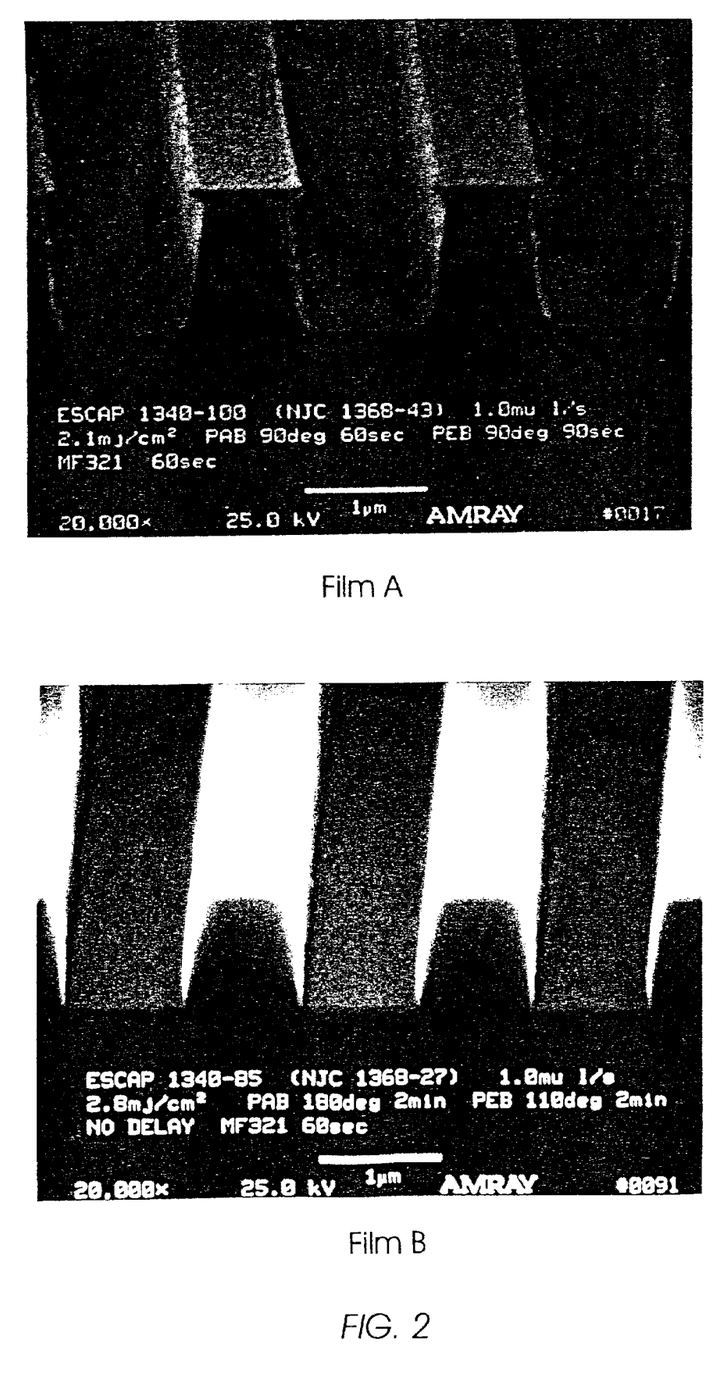

Lithographic Performance (Methacrylate/p-hydroxystyrene)copolymer with a weight-average molecular weight of 36,100 containing 20 mole % of the t-butyl methacrylate unit (Tg=166° C.) was dissolved together with 2.5 wt % of triphenylsulfonium trifluoromethanesulfonate in propylene glycol monomethyl ether acetate. Two spin-cast resist films were pre-exposure-baked (film A) at 90° C. for 60 sec and (film B) at 180° C. for 2 min, exposed on a Ultratech 248 nm 1× stepper, postexposure-baked (film A) at 90° C. for 90 sec or (film B) at 110° C. for 2 min, and developed (with Shipley Microposit MF321 for 60 sec). In FIG. 2, there is shown scanning electron micrographs of the two films (film B) as positive image free of the T-top structure while the film A had T-top profiles.

EXAMPLE IX

Lithographic Performance

Figure 3:
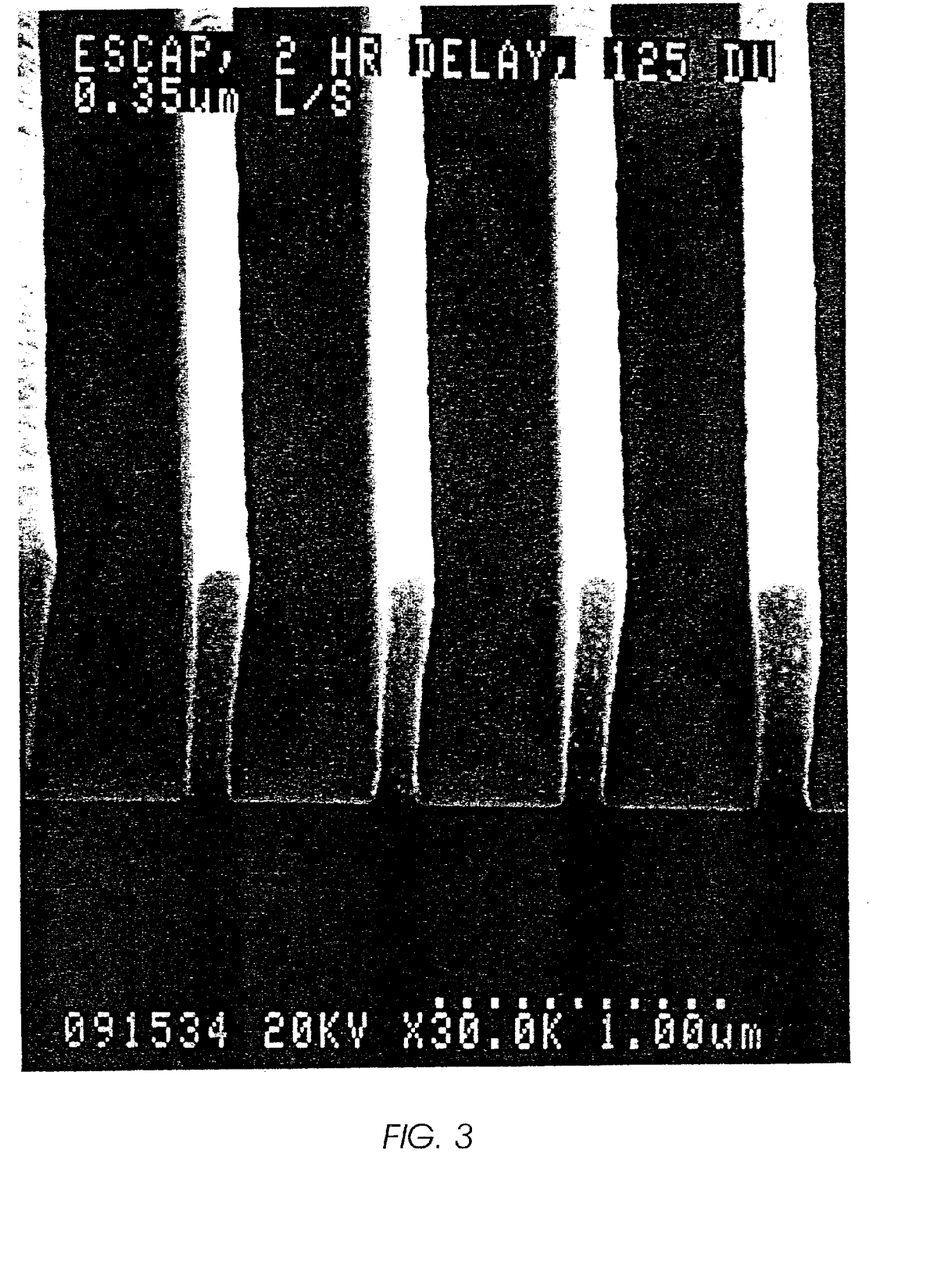

A copolymer of p-hydroxystyrene with t-butyl acrylate (65:35 composition, 34,600 weight-average molecular weight (Tg 153° C.) was mixed with 2.5 wt % of N-camphorsulfonyloxynaphthalimide in propylene glycol monomethyl ether acetate. Spin-cast films were pre-exposure-baked at 150° C. for 2 min, exposed on a GCA KrF excimer laser stepper with 0.42 NA, allowed to stand for 2 hr, postexposure-baked at 150° C. for 2 min, and developed with MF321 for 60 sec. In FIG. 3 there is shown scanning electron micrographs of the excellent positive images unaffected by NMP including 0.35 μm line/space arrays without any line width shift.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A process for generating a resist image on substrate comprising the steps of:
    a. coating the substrate with a polymeric film comprising (i) vinyl polymer (ii) a photosensitive acid generator, and (iii) acid labile groups;
    b. heating the film to a temperature which is (i) above about 20° C. below the glass transition temperature of the polymer and (ii) below the cleavage temperature of the acid labile groups;
    c. imagewise exposing the film to radiation to generate free acid;
    d. heating the film to a temperature above about 110° C.; and
    e. developing the image.

2. The process of claim 1 comprising heating the film in step(d) to a temperature above about 120° C.

3. The process of claim 2 comprising heating the film in step(b) to a temperature which is at or above the glass transition temperature of the vinyl polymer.

4. The process of claim 3 wherein said radiation is deep ultraviolet.

5. The process of claim 4 wherein the image is developed in aqueous base.

6. The process of claim 5 wherein the image is a positive tone.

7. The process of claim 6 wherein said vinyl polymer is poly(m-t-butoxycarbonyloxystyrene).

8. The process of claim 6 wherein said vinyl polymer is meta-(t-butoxycarbonyloxystyrene-co hydroxystyrenes).

9. The process of claim 6 wherein said vinyl polymer is comprised of hydroxystyrene and a monomer having an acid labile group.

10. The process of claim 9 wherein said photosensitive acid generator is N-sulfonyloxynaphthalimide.

11. The process of claim 3 wherein said acid labile group is an acid cleavable ester group.

12. The process of claim 11 wherein said ester group is the t-butyl ester of carboxylic acid.

13. A process for generating a resist image on substrate comprising the steps of:
    a. coating the substrate with a film comprising (i) photosensitive acid generator and (ii) a vinyl polymer selected from poly(m-t-butoxycarbonyloxystyrene) or poly meta-(t-butoxycarbonyloxystyrene-cohydroxystyrene);
    b. heating the film to a temperature which is (i) at or above the glass transition temperature of the vinyl polymer and (ii) below the cleavage temperature of the acid cleavable pendant group;
    c. imagewise exposing the film to radiation to generate free acid;
    d. heating the film to a temperature which is (i) at or above the glass transition temperature of the vinyl polymer and (ii) below the cleavage temperature of the acid cleavable pendant group; and
    e. developing the image.

14. The process of claim 13 wherein the radiation is deep ultraviolet.

* * * * *